(12) United States Patent
Shin

(10) Patent No.: US 10,714,687 B2
(45) Date of Patent: Jul. 14, 2020

(54) DISPLAY PANEL MANUFACTURING DEVICE

(71) Applicant: Samsung Display Co., Ltd., Yongin-Si, Gyeonggi-do (KR)

(72) Inventor: Hyea-Weon Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/459,485

(22) Filed: Mar. 15, 2017

(65) Prior Publication Data

US 2017/0186956 A1 Jun. 29, 2017

Related U.S. Application Data

(62) Division of application No. 13/917,533, filed on Jun. 13, 2013, now Pat. No. 9,610,779.

(30) Foreign Application Priority Data

Dec. 28, 2012 (KR) .......................... 10-2012-0157330

(51) Int. Cl.
*H01L 51/00* (2006.01)
*B05C 13/00* (2006.01)
(Continued)

(52) U.S. Cl.
CPC ............ *H01L 51/0012* (2013.01); *B05C 5/00* (2013.01); *B05C 13/00* (2013.01); *B41J 3/407* (2013.01);
(Continued)

(58) Field of Classification Search
None
See application file for complete search history.

(56) References Cited

U.S. PATENT DOCUMENTS 8,220,898 B2   7/2012  Ito
8,318,237 B2  11/2012  Kinoshita
(Continued)

FOREIGN PATENT DOCUMENTS

CN    101837683 A    9/2010
CN    102189061 A    9/2011
(Continued)

OTHER PUBLICATIONS

SIPO Office Action dated Oct. 8, 2016, for corresponding Chinese Patent Application No. 201310268287.1, (8 pages).
(Continued)

*Primary Examiner* — Jethro M. Pence
(74) *Attorney, Agent, or Firm* — Lewis Roca Rothgerber Christie LLP

(57) ABSTRACT

A display panel manufacturing device including a stage slider, a first stage configured to slide on the stage slider and to receive a test substrate, a second stage on the stage slider and configured to receive a main substrate, and a patterning unit located at a distance from the stage slider and configured to discharge organic drops onto the test substrate, configured to analyze patterns of the organic drops, configured to modify the patterns of the discharged organic drops according to an analysis of the patterns of the organic drops, and configured to discharge the organic drops onto the main substrate.

9 Claims, 7 Drawing Sheets

(51) Int. Cl.
  *H01L 51/56* (2006.01)
  *B05C 5/00* (2006.01)
  *B41J 3/407* (2006.01)
(52) U.S. Cl.
  CPC .......... *H01L 51/0005* (2013.01); *H01L 51/56* (2013.01)

(56) References Cited

U.S. PATENT DOCUMENTS

| | | | |
|---|---|---|---|
| 8,573,075 | B2 | 11/2013 | Kojima |
| 2007/0296758 | A1 | 12/2007 | Miller et al. |
| 2008/0139072 | A1 | 6/2008 | Kinoshita |
| 2008/0286442 | A1 | 11/2008 | Ushiyama et al. |
| 2010/0238228 | A1 | 9/2010 | Ito |
| 2011/0209566 | A1 | 9/2011 | Kojima |
| 2012/0040478 | A1* | 2/2012 | Takeuchi ............ H01L 27/3246 438/23 |
| 2012/0098416 | A1 | 4/2012 | Cho et al. |

FOREIGN PATENT DOCUMENTS

| | | |
|---|---|---|
| JP | 6-270531 A | 9/1994 |
| JP | H11248927 A | 9/1999 |
| JP | 2002-289664 A | 10/2002 |
| JP | 2003-251243 | 9/2003 |
| JP | 2004-342919 A | 12/2004 |
| JP | 2006-15243 A | 1/2006 |
| JP | 2007-185609 A | 7/2007 |
| JP | 2008-142654 A | 6/2008 |
| JP | 2010-199264 A | 9/2010 |
| JP | 2010-214318 A | 9/2010 |
| JP | 2011-161308 A | 8/2011 |
| JP | 2011-177643 A | 9/2011 |
| JP | 2011-255366 A | 12/2011 |
| KR | 10-2005-0014368 A | 2/2005 |
| KR | 10-0556625 | 3/2006 |
| KR | 10-2008-0014626 | 2/2008 |
| KR | 10-2011-0013917 A | 2/2011 |

OTHER PUBLICATIONS

Korean Patent Abstracts Publication No. KR1020040017213 A, dated Feb. 26, 2004, cited for KR10-0556625, 1 page.

* cited by examiner

DISPLAY PANEL MANUFACTURING DEVICE

CROSS-REFERENCE TO RELATED PATENT APPLICATION

This application is a divisional of U.S. patent application Ser. No. 13/917,533, filed on Jun. 13, 2013, which claims priority to and the benefit of Korean Patent Application No. 10-2012-0157330, filed on Dec. 28, 2012, the entire contents of both of which are incorporated herein by reference

BACKGROUND

1. Field

Embodiments of the present invention relate to a display panel manufacturing device.

2. Description of the Related Art

Electronic devices based on mobility have been widely used. In addition to a a small electronic device, such as a mobile phone, a tablet personal computer (PC) has also been widely used as a mobile electronic device.

Mobile electronic devices include a display apparatus to provide visual information, such as an image, to a user to support various functions. Other parts for driving the display apparatus have been made small, and thus a weight of the display apparatus of the mobile electronic device has increased. Also, display apparatuses have been developed to have a bendable structure to be bent at an angle from a flat state.

The display apparatus includes a display panel, which may be formed in various forms and by using various manufacturing methods.

Various types of processes may be used to form various types of layers on the display panel. In particular, when an organic material of the various types of layers of the display panel is used, the organic material may be stacked, or a structure may be formed, through a printing process. Here, in general, organic drops (e.g., droplets) are discharged to form various types of layers or structures in a printing technique. In the printing technique, factors such as a resolution, etc. of the display panel are determined according to a method of forming patterns of the organic drops. Therefore, the organic drops are pre-patterned on a test substrate, and are then patterned on a main substrate. However, when the organic drops are patterned on the test substrate as described above, the organic drops are patterned in an additional space not in a process of manufacturing the main substrate.

SUMMARY

Embodiments of the present invention provide a display panel manufacturing device which precisely discharges organic drops.

According to an aspect of an embodiment of the present invention, there is provided a display panel manufacturing device including a stage slider, a first stage configured to slide on the stage slider and configured to receive a test substrate, a second stage at the stage slider and configured to receive a main substrate, and a patterning unit located at a distance from the stage slider and configured to discharge organic drops onto the test substrate, configured to analyze patterns of the organic drops, configured to modify the patterns of the discharged organic drops according to an analysis of the patterns of the organic drops, and configured to discharge the organic drops onto the main substrate.

The display panel manufacturing device may further include test substrate raising and lowering units at the first stage that are configured to separate the test substrate from the first stage.

The display panel manufacturing device may further include a substrate providing unit configured to load the test substrate onto the first stage, configured to unload the test substrate from the first stage, configured to load the main substrate onto the second stage, or configured to unload the main substrate from the second stage.

The display panel manufacturing device may further include a drying unit located at a distance from the stage slider and configured to dry organic drops discharged onto the test substrate.

The display panel manufacturing device may further include a third stage facing the drying unit and configured to receive the test substrate thereon.

The patterning unit may include a main frame located at a distance from the stage slider and configured to move in a longitudinal direction of the stage slider and in a direction perpendicular to the longitudinal direction, and one or more drop dischargers located at the main frame and configured to discharge the organic drops onto the test substrate or the main substrate.

The patterning unit may further include a pattern analyzer located at the main frame and configured to analyze patterns of the organic drops discharged from the drop dischargers onto the test substrate.

The patterning unit may further include a pattern analyzer located at a distance from the main frame and the stage slider and configured to analyze patterns of the organic drops discharged onto the test substrate.

The display panel manufacturing device may further include a fourth stage located at a lower surface of the pattern analyzer and configured to receive the test substrate thereon after the patterns of the organic drops are formed on the test substrate.

The first stage may include aligned marks thereon.

The display panel manufacturing device may further include a test substrate heating unit inside the first stage to control a surface temperature of the first stage.

The first and second stages may be separated from each other or may be coupled to each other.

According to another aspect of an embodiment of the present invention, there is provided a display panel manufacturing device including a stage slider, a second stage at the stage slider and configured to receive a test substrate or a main substrate thereon, and a patterning unit located at a distance from the stage slider, and configured to discharge organic drops onto the test substrate, configured to analyze patterns of the organic drops to enable modification of the patterns of the discharged organic drops, and configured to discharge the modified patterns onto the main substrate.

The second stage may include a test substrate placing unit configured to place the test substrate on the second stage.

The test substrate placing unit may include a test substrate heating unit configured to heat the test substrate to harden the organic drops.

The display panel manufacturing device may further include test substrate raising and lowering units located at the second stage and configured to separate the test substrate from the second stage.

The display panel manufacturing device may further include a substrate providing unit configured to move in a longitudinal direction of the stage slider and configured to load the test substrate onto the second stage or to unload the test substrate from the second stage.

The display panel manufacturing device may further include a drying unit located at a distance from the stage slider and configured to dry the organic drops discharged onto the test substrate.

The display panel manufacturing device may further include a third stage facing the drying unit and configured to receive the test substrate thereon.

The patterning unit may include a main frame located at a distance from the stage slider and configured to move in a longitudinal direction of the stage slider and in a direction perpendicular to the longitudinal direction, and one or more drop dischargers located at the main frame and configured to discharge the organic drops onto the test substrate or the main substrate.

The patterning unit may include a pattern analyzer located at the main frame and configured to analyze patterns of the organic drops discharged from the drop dischargers onto the test substrate.

The patterning unit may further include a pattern analyzer located at a distance from the main frame and the stage slider and configured to analyze the patterns of the organic drops discharged onto the test substrate.

The display panel manufacturing device may further include a fourth stage located at a lower surface of the pattern analyzer and configured to receive the test substrate, on which the patterns of the organic drop are formed, thereon.

The display panel manufacturing device may further include aligned marks on the second stage.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Embodiments of the present invention will now be described more fully with reference to the accompanying drawings, in which exemplary embodiments of the invention are shown. The described embodiments of the present invention may, however, be embodied in many different forms and should not be construed as being limited to the embodiments set forth herein; rather, these embodiments are provided so that this disclosure will be thorough and complete, and will fully convey the concept of the invention to those skilled in the art. The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will be understood that, although the terms, 'first', 'second', etc. may be used herein to describe various elements, these elements should not be limited by these terms. These terms are only used to distinguish one element from another.

Figure 1:
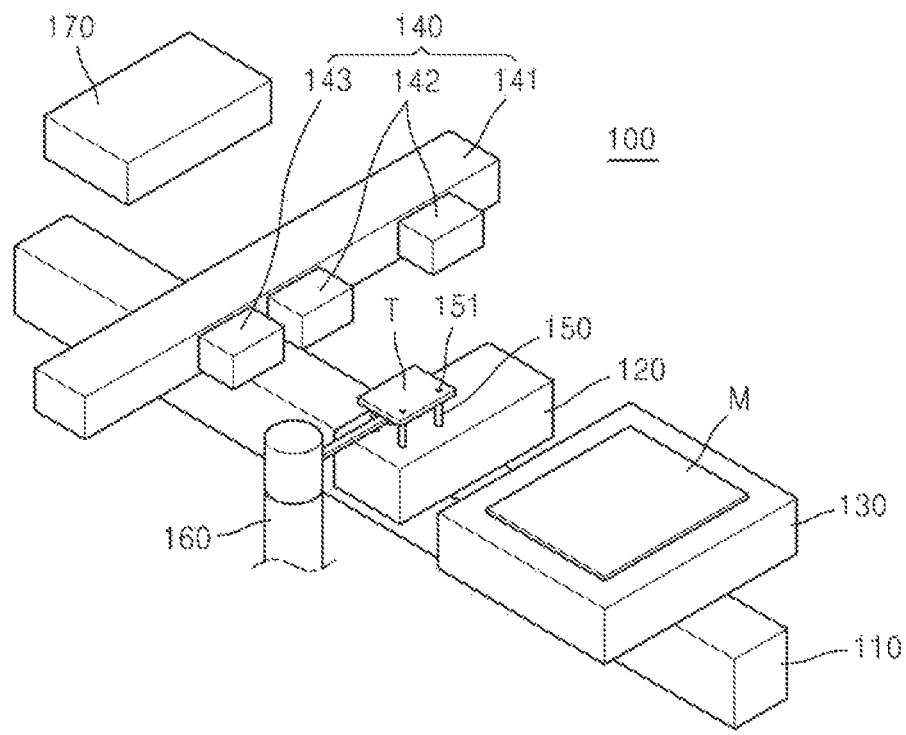
FIG. 1 is a view illustrating a display panel manufacturing device according to an exemplary embodiment of the present invention.

FIG. 1 is a view illustrating a display panel manufacturing device 100 according to an exemplary embodiment of the present invention. FIGS. 2A through 2G are views illustrating a process of manufacturing a display panel using the display panel manufacturing device 100 of the embodiment shown in FIG. 1.

Referring to FIGS. 1 and 2A through 2G, the display panel manufacturing device 100 includes a stage slider 110, which is installed to slide a first stage 120 or a second stage 130 thereon, wherein the first and second stages 120 130 will be described later. In particular, the stage slider 110 includes a linear motion (LM) guide.

The display panel manufacturing device 100 includes the stage slider 110 to allow, for example, the first stage 120 to slide on the stage slider 110, the first stage 120 having a test substrate T placed thereon. In the present embodiment, aligned marks (e.g., alignment marks) 151 are formed on the first stage 120 to arrange the test substrate T (e.g., to ensure proper alignment of the test substrate T with respect to the first stage 120).

The display panel manufacturing device 100 includes a second stage 130 that is installed on the stage slider 110, the second stage 130 having a main substrate M placed thereon. In the present embodiment, at least one of the first and second stages 120 and 130 is installed on the stage slider 110 to linearly move along the stage slider 110.

The display panel manufacturing device 100 includes a patterning unit 140, which is installed to maintain a distance from the stage slider 110, and which discharges organic drops O to the test substrate T. The patterning part 140 checks patterns of the organic drops O discharged from the test substrate T, modifies the patterns of the organic drops O, and discharges the organic drops O having the modified patterns to the main substrate M.

In the present embodiment, the patterning unit 140 includes a main frame 141 for maintaining a distance from the stage slider 110 that is installed to move in a longitudinal direction of the stage slider 110 and in a direction perpendicular to the longitudinal direction. In the present embodiment, the main frame 141 may be installed on a fixed frame to be fixed to an outside to move as described above.

The patterning unit 140 includes a drop discharger 142 installed at the main frame 141 to discharge the organic drops O to the test substrate T or the main substrate M. In the present embodiment, the patterning unit 140 includes a pattern analyzer 143 installed at the main frame 141 to analyze the patterns of the organic drops O discharged from the drop discharger 142 to the test substrate T. In the present embodiment, the pattern analyzer 143 includes a camera or the like to capture the patterns of the organic drops O, or includes a sensor to sense the patterns of the organic drops O.

The display panel manufacturing device 100 includes test substrate raising and falling (e.g., raising and lowering) units 150 that are installed on the first stage 120 to separate the test substrate T from the first stage 120. In the present embodiment, a plurality of test substrate raising and falling units 150 may be installed on the first stage 120 at intervals, spaced from one another. The test substrate raising and falling units 150 may include cylinders which operate using an oil pressure or an air pressure, and may elevate the test substrate T through shafts, gear modules, motors, etc.

The display panel manufacturing device 100 includes a substrate providing unit 160 that is installed to keep a distance from the stage slider 110. In the present embodiment, the substrate providing unit 160 loads the test substrate T onto the first stage 120, unloads the test substrate T from the first stage 120, loads the main substrate M onto the second stage 130, or unloads the main substrate M from the second stage 130.

The substrate providing unit 160 may have various forms. For example, the substrate providing unit 160 may have the form of a robot arm, and a part of the substrate providing unit 160 may be rotated to load or unload the test substrate T or the main substrate M.

The substrate providing unit 160 is installed to move according to a position of the first stage 120 or a position of the second stage 130, and may be installed at the fixed frame.

The substrate providing unit 160 includes a drop drying unit (e.g., drying unit) 170 that is installed at a distance from the stage slider 110, and to maintain the distance from the stage slider 110. The drop drying unit 170 dries the organic drops O discharged to the test substrate T. In detail, the drop drying unit 170 is moveable to contact the test substrate T after the organic drops O are discharged to the test substrate T to maintain a vacuum state and to apply heat to dry the organic drops O.

Figure 2A:
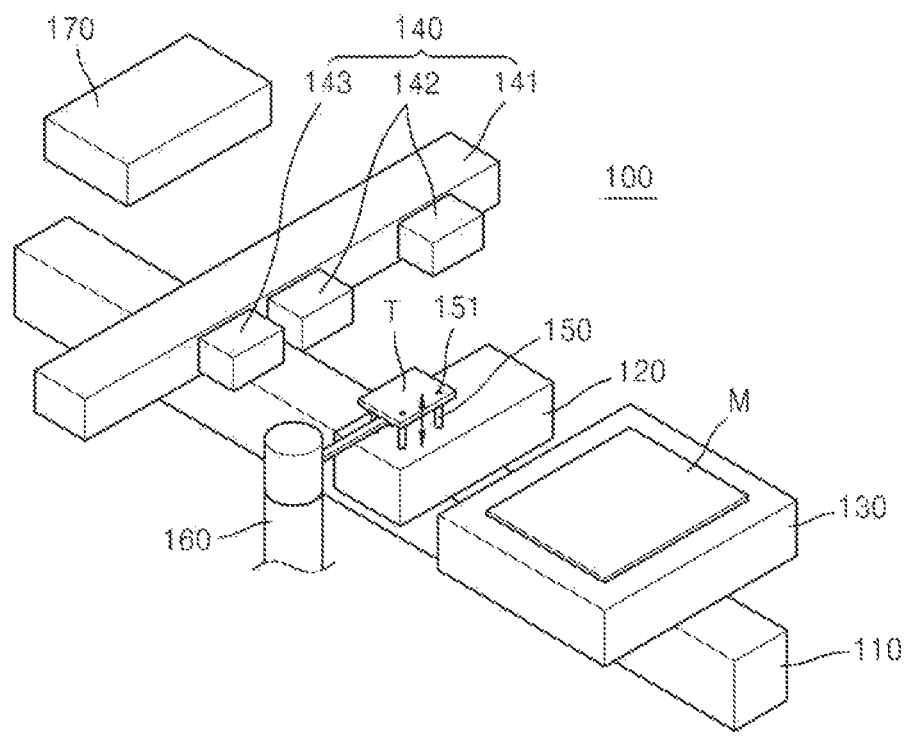
FIGS. 2A through 2G are views illustrating a process of manufacturing a display panel through the display panel manufacturing device of the embodiment shown in FIG. 1.
Figure 2B:
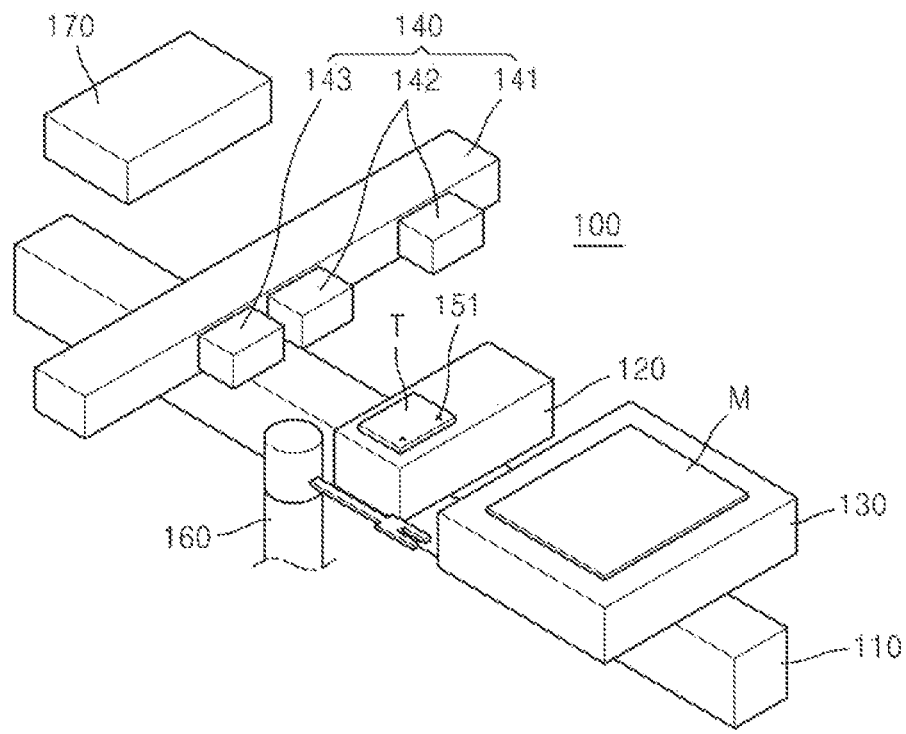

A method of operating the display panel manufacturing device 100 of the embodiment described above will now be described with reference to FIGS. 2A and 2B. The test substrate T and the main substrate M are respectively aligned on the first and second stages 120 and 130.

In the present embodiment, the test substrate T is placed on the first stage 120 by the substrate providing unit 160, which places the test substrate T on the first stage 120 so that the test substrate T faces the aligned marks 151. In the present embodiment, precision is attained according to an operation of the substrate providing unit 160. Therefore, the test substrate T is placed on the first stage 120 to face the aligned marks 151.

When the test substrate T is loaded by the substrate providing unit 160, the test substrate raising and falling units 150 rise to support the test substrate T, and then fall to place the test substrate T on the first stage 120.

Figure 2C:
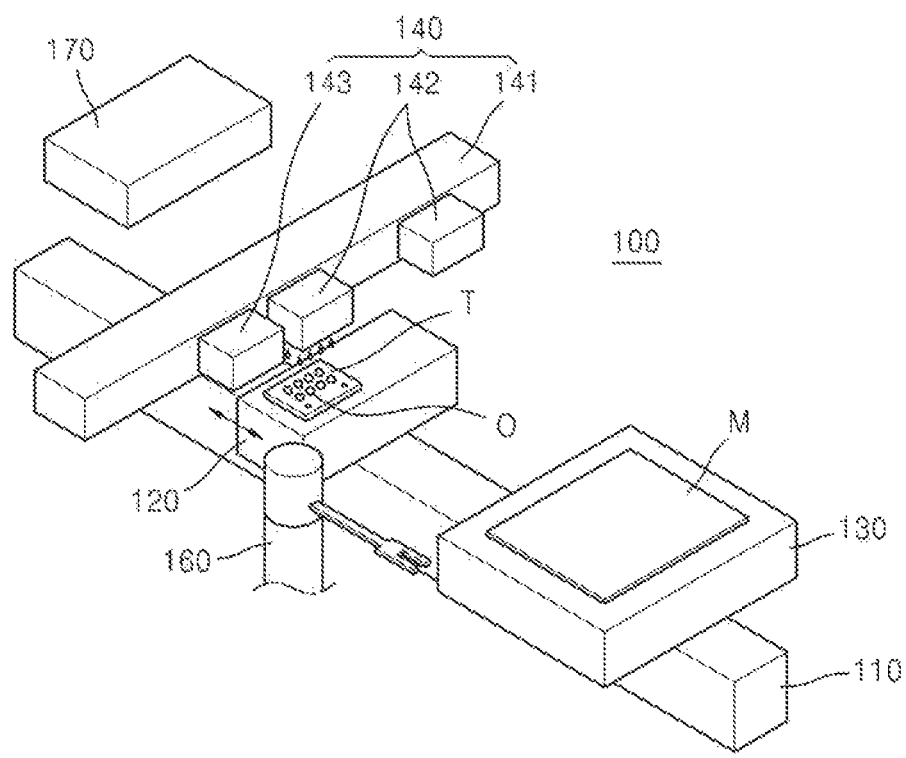

Referring to FIG. 2C, the organic drops O are discharged from the drop discharger 142 onto the test substrate T through the patterning unit 140. In the present embodiment, examples of an organic material forming the organic drops O may include all types of organic material that is used for manufacturing a display panel. Examples of the organic material may include an organic material for forming a pixel defined layer (PDL), an organic material for forming a passivation layer, and/or an organic material for forming an organic emission layer.

Figure 2D:
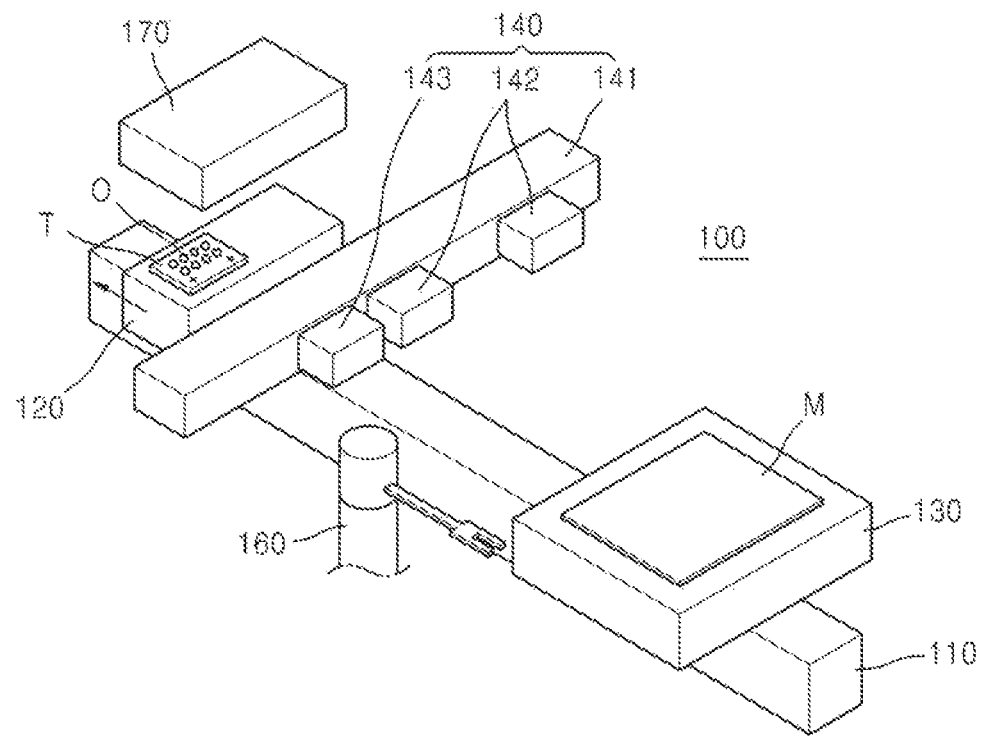
Figure 2E:
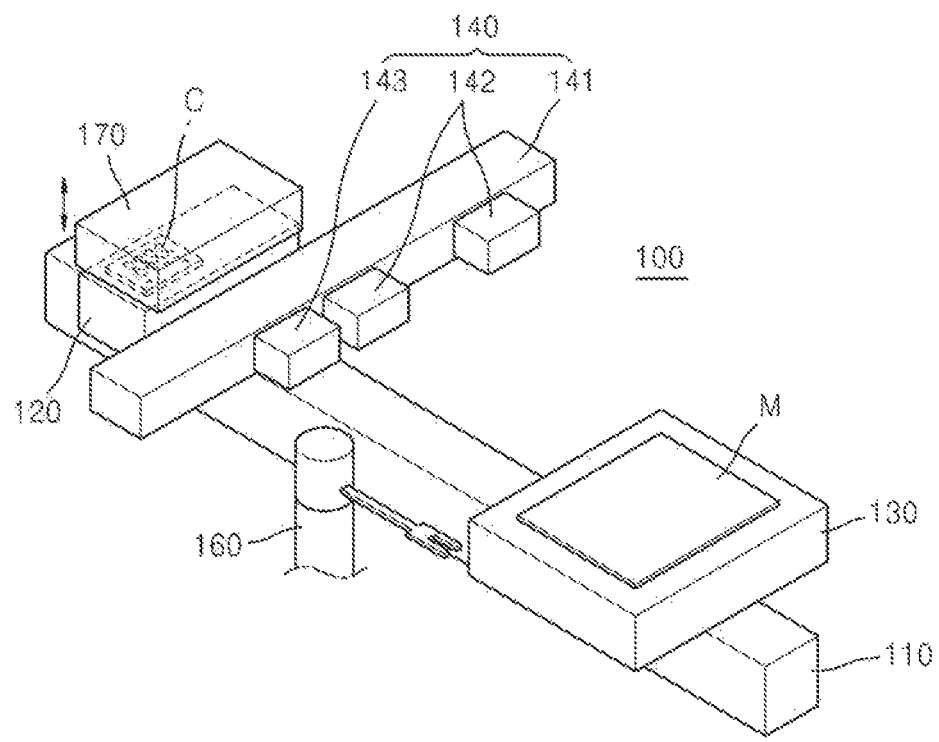
Figure 2F:
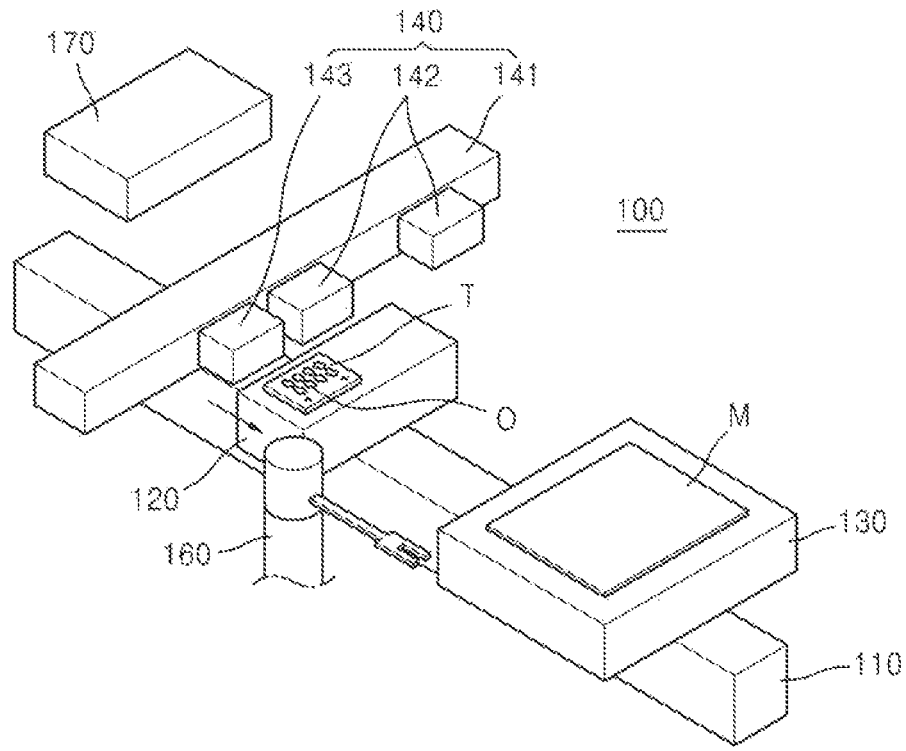

After the organic drops O are discharged to form patterns of the organic drops O on the test substrate T, the first stage 120 is moved to be located below, or at a lower surface of, the drop drying unit 170 as shown in FIG. 2D. In the present embodiment, the first stage 120 slides on the stage slider 110 to be moved by one or more various types of driving devices. For example, a driving device may include a motor, a cylinder, etc. to move the first stage 120.

When the above-described process is completed, the drop drying unit 170 falls to contact the test substrate T. Also, the test substrate T may be completely inserted into the drop drying unit 170 without contacting the drop drying unit 170. However, for purposes of description, the drop drying unit 170 will be described as contacting the test substrate T.

When the drop drying unit 170 contacts the test substrate T, the drop drying unit 170 maintains contact with the test substrate T in a vacuum state. The drop drying unit 170 applies heat to the part thereof contacting the test substrate T to harden the patterns of the organic drops O on the test substrate T. By applying heat, a time required for naturally drying the patterns of the organic drops O is reduced to reduce a work time.

After the patterns of the organic drops O on the test substrate T are hardened, as described above, the drop drying unit 170 is raised and separated from the test substrate T. Then, the first stage 120 is moved again. In the present embodiment, the first stage 120 slides on the stage slider 110 to be at a lower surface of the patterning unit 140.

When the first stage 120 is positioned as described above, the main frame 141 is moved in a direction perpendicular to the longitudinal direction of the stage slider 110 to locate the pattern analyzer 143 on or above the test substrate T.

The pattern analyzer 143 analyzes the patterns of the organic drops O on the test substrate T. In the present embodiment, the pattern analyzer 143 captures the patterns of the organic drops O (e.g., captures an image of the patterns of the organic drops O) and compares the captured patterns/images with preset patterns of the organic drops O to analyze the patterns of the organic drops O on the test substrate T.

The pattern analyzer 143 modifies the patterns of the organic drops O discharged from the drop discharger 142 based on the analyzed patterns of the organic drops O. In detail, the pattern analyzer 143 compares the patterns of the discharged organic drops O with the preset patterns of the organic drops O to modify a discharge speed, a discharged amount, discharged positions, etc. of the organic drops O.

Figure 2G:
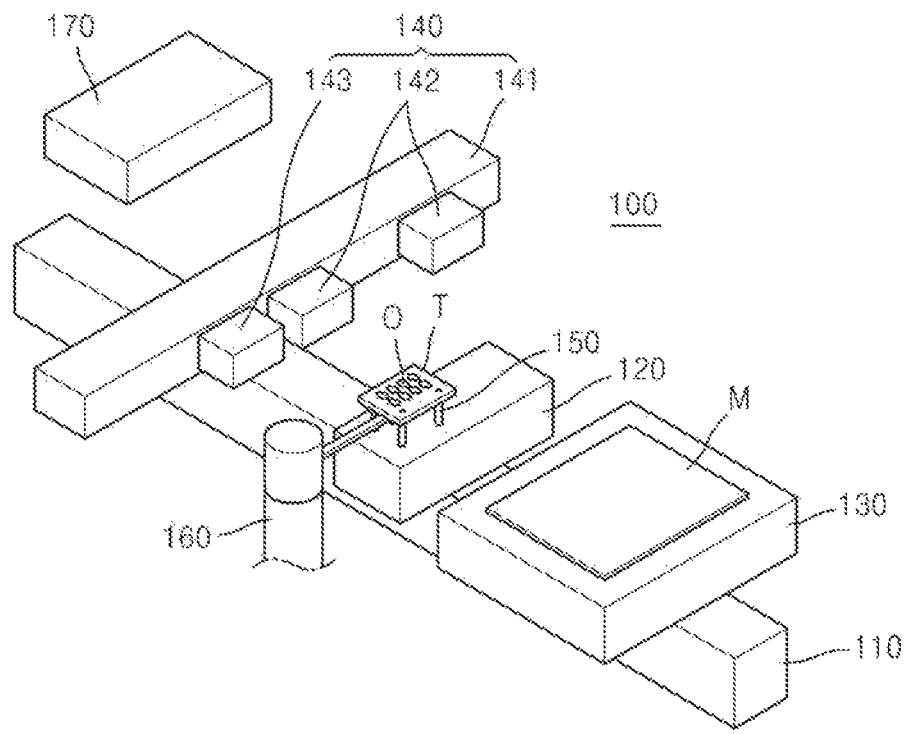

When the patterns of the organic drops O on the test substrate T are analyzed as described above, the test substrate T is separated from the first stage 120 through the test substrate raising and falling units 150, as shown in FIG. 2G. In the present embodiment, when operations of the test substrate raising and falling units 150 are completed, the test substrate T is unloaded by the substrate providing unit 160 to be withdrawn to an outside (e.g., to be separated from the display panel manufacturing device 100).

When the above-described process is completed, the patterning unit 140 is transferred. In detail, the main frame 141 performs a linear motion (e.g., is moved) in the longitudinal direction of the stage slider 110 to position the drop discharger 142 on/over the main substrate M. In the present embodiment, a plurality of drop dischargers 142 may be located at intervals. For example, the plurality of drop dischargers 142 may be fixed to the main frame 141, or may be moveably installed at the main frame 141. The plurality of drop dischargers 142 may be variously located according to the patterns of the organic drops O for manufacturing the display panel.

When a position of the patterning unit 140 is aligned as described above, the organic drops O are discharged onto the main substrate T by the drop discharger 142 to manufacture the display panel. In the present embodiment, a method of manufacturing the display panel is similar to a general method, and thus a detailed description thereof will be omitted.

Therefore, the display panel manufacturing device 100 separately tests the test substrate T outside (e.g., apart from the main substrate M) and does not need to apply the test substrate T to the main substrate M. As a result, logistical cost and manufacturing time are reduced. Also, the display panel manufacturing device 100 tests the test substrate T in conditions similar to the manufacturing conditions of the main substrate M to enable a more accurate test. Also, the display panel manufacturing device 100 immediately applies a test result through a feedback, and thus the display panel is more precisely manufactured, and a failure rate is reduced.

Figure 3:
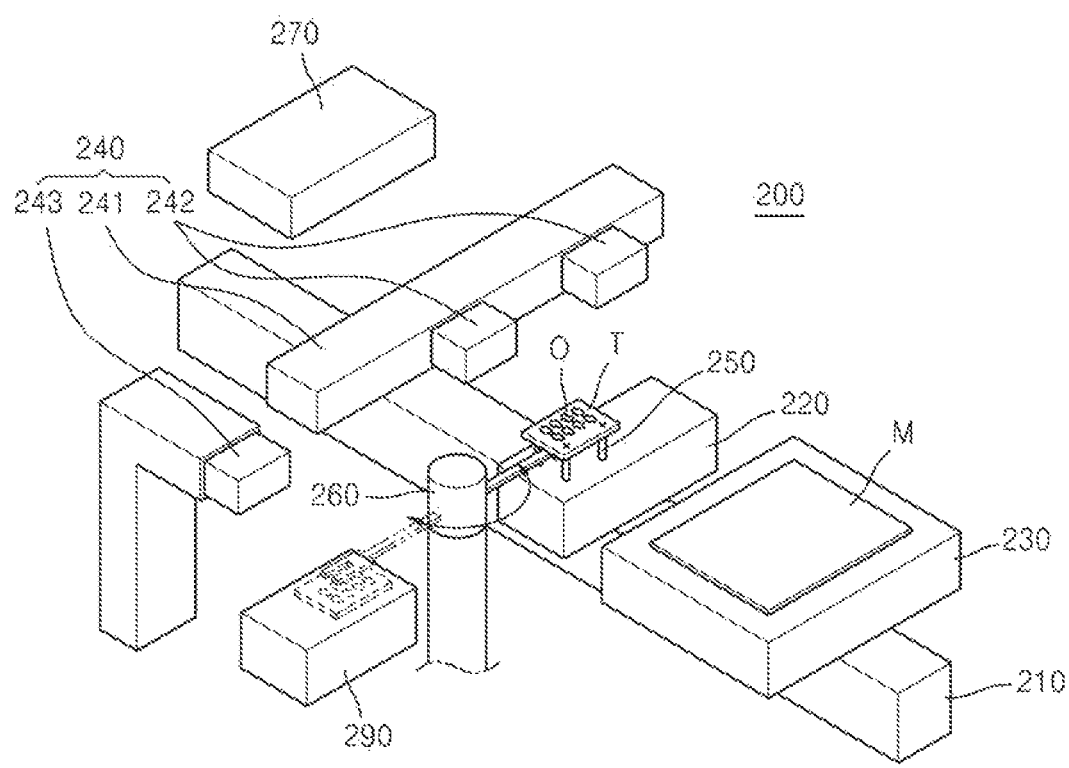
FIG. 3 is a view illustrating a display panel manufacturing device according to another exemplary embodiment of the present invention.

FIG. 3 is a view illustrating a display panel manufacturing device 200 according to another exemplary embodiment of the present invention. Referring to FIG. 3, the display panel manufacturing device 200 includes a stage slider 210, a first stage 220, a second stage 230, a patterning unit 240, test substrate raising and falling units (e.g., raising and lowering units) 250, a substrate providing unit 260, and a drop drying unit (e.g., drying unit) 270. In the present embodiment, the stage slider 210, the first stage 220, the second stage 230, the test substrate raising and falling units 250, the substrate providing unit 260, and the drop drying unit 270 are respectively similar to the stage slider 110, the first stage 120, the second stage 130, the test substrate raising and falling units 150, the substrate providing unit 160, and the drop drying unit 170 described with reference to FIGS. 1 and 2A through 2G, and their detailed descriptions will be omitted.

The patterning unit 240 includes a main frame 241, drop dischargers 242, and a pattern analyzer 243. In the present embodiment, the main frame 241 and the drop dischargers 242 are similar to the main frame 141 and the drop dischargers 142 described with reference to FIGS. 1 and 2A through 2G, and thus their detailed descriptions will be omitted.

The pattern unit 240 includes the pattern analyzer 243 as described above. In the present embodiment, the pattern analyzer 243 is installed to keep a distance from the main frame 241 and the stage slider 210. In detail, the pattern analyzer 243 may be fixed to a fixed frame. In the present embodiment, the pattern analyzer 243 analyzes patterns of organic drops O discharged to a test substrate T, as described above.

The display panel manufacturing device 200 of the present embodiment includes a fourth stage 290 that is located on a lower surface of the pattern analyzer 243 to be placed on the test substrate T. After the patterns of the organic drops O are formed on the first stage 220, the test substrate T is placed on the fourth stage 290 is by the substrate providing unit 260. The fourth stage 290 may be aligned with the first stage 220, and the substrate providing unit 260 may be located between the first stage 220 and the fourth stage 290.

A method of operating the display panel manufacturing device 200 will be similar to the above-described method of operating the display panel manufacturing device 100 of the embodiment shown in FIGS. 1 and 2A to 2G. In detail, the test substrate T is loaded on the first stage 220 by the substrate providing unit 260. In the present embodiment, after the test substrate raising and falling units 250 rise to receive the test substrate T thereon, the test substrate raising and falling units 250 fall to place the test substrate T on the first stage 220.

When the above-described process is completed, the drop dischargers 242 discharge the organic drops O onto the test substrate T, and the first stage 220 is moved to locate the test substrate T on a lower surface of (e.g., in or below) the drop drying unit 270. In the present embodiment, the drop drying unit 270 dries the organic drops O on the test substrate T similarly to the above-described drying method.

When the organic drops O are completely dried, the test substrate T is transferred from the first stage 220 onto the fourth stage 290. In the present embodiment, the test substrate T may be transferred according to various methods. For example, after the first stage 220, the test substrate T may be transferred onto the fourth stage 290 by the substrate providing unit 260. Also, after a position of the first stage 220 is fixed, the test substrate T may be unloaded from the first stage 220 by the substrate providing unit 260, and then the substrate providing unit 260 may transfer the test substrate T onto the fourth stage 290. However, for descriptive convenience, a method of transferring the test substrate T from the first stage 220 onto the fourth stage 290 will be hereinafter described in detail.

In detail, when the organic drops O on the test substrate T are completely dried, the first stage 220 is moved to an original position thereof. In the present embodiment, the test substrate raising and falling units 250 operate to separate the test substrate T from the first stage 220, and then the substrate providing unit 260 transfers the test substrate T onto the fourth stage 290.

When the test substrate T is placed on the fourth stage 290, as described above, the pattern analyzer 243 checks the patterns of the organic drops O in a manner similar to the above-described checking method, and thus a detailed description thereof will be omitted.

After the patterns of the organic drops O are analyzed, as described above, the drop dischargers 242 are controlled based on the analysis result to adjust the organic drops O discharged from the drop dischargers 242. In the present embodiment, a method and a factor for adjusting the organic drops O are similar to those described above, and thus their detailed descriptions will be omitted. In the present embodiment, the main frame 241 is positioned on or above the main substrate M, and the drop dischargers 242 discharge the organic drops O onto the main substrate M.

Accordingly, the display panel manufacturing device 200 separately tests the test substrate T outside (e.g., the test substrate T is tested separately and by itself) and does not need to apply the test substrate T to the main substrate M. Therefore, logistical cost and manufacturing time are reduced. Also, the display panel manufacturing device 200 tests the test substrate T in conditions similar to the manufacturing conditions of the main substrate M to enable a more accurate test. The display panel manufacturing device 200 quickly applies the test through a feedback, and thus a display panel is more precisely manufactured, and a failure rate is reduced.

Figure 4:
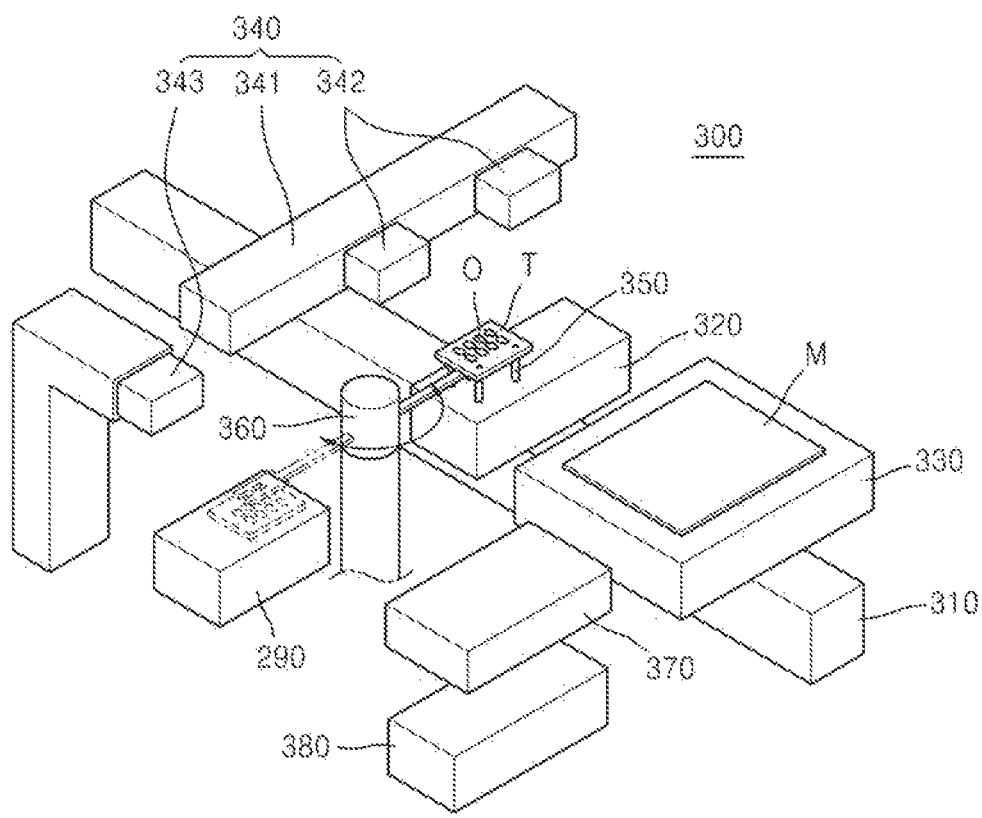
FIG. 4 is a view illustrating a display panel manufacturing device according to another exemplary embodiment of the present invention.

FIG. 4 is a view illustrating a display panel manufacturing device 300 according to another exemplary embodiment of the present invention. Referring to FIG. 4, the display panel manufacturing device 300 includes a stage slider 310, a first stage 320, a second stage 330, a fourth stage 390, a patterning unit 340, test substrate raising and falling units 350, a substrate providing unit 360, and a drop drying unit (e.g., drying unit) 370. The stage slider 310, the first stage 320, the second stage 330, the fourth stage 390, the test substrate raising and falling units (e.g., the test substrate raising and lowering units) 350, the substrate providing unit 360, and the drop drying unit 370 are respectively similar to the stage slider 210, the first stage 220, the second stage 230, the fourth stage 290, the test substrate raising and falling units 250, the substrate providing unit 260, and the drop drying unit 270, and thus their detailed descriptions will be omitted.

The patterning unit 340 includes a main frame 341, drop dischargers 342, and a pattern analyzer 343. In the present embodiment, the main frame 341, the drop dischargers 342, and the pattern analyzer 343 are similar to the first main frame 241, the drop dischargers 242, and the pattern analyzer 243 described with reference to FIG. 3, and thus their detailed descriptions will be omitted.

The display panel manufacturing device 300 of the present embodiment includes a third stage 380 that is located to face the drop drying unit 370 and to place a test substrate T thereon. In the present embodiment, when the drop drying unit 370 dries the test substrate T, the test substrate T is placed on the third stage 380 to be supported by the third stage 380. When the third stage 380 is installed as described above, the drop drying unit 370 is not located on the stage slider 310, but is located to face the third stage 380. When the third stage 380 and the drop drying unit 370 are oriented in the manner shown, the third stage 380 and the drop drying unit 370 may be installed in a space separately from the stage slider 310, the first stage 320, the second stage 330, etc.

A method of operating the display panel manufacturing device 300 may be performed as described in the previous exemplary embodiments. In detail, the test substrate T is loaded on the first stage 320 by the substrate providing unit 360. In the present embodiment, when, after the test substrate raising and falling units 350 rise and the test substrate T is placed thereon, the test substrate raising and falling units 350 fall/lower to place the test substrate T on the first stage 320.

When the above-described process is completed, the drop dischargers 342 discharge organic drops O onto the test substrate T. When the organic drops O are completely discharged onto the test substrate T on the first stage 320, the test substrate raising and falling units 350 raise the test substrate T. In the present embodiment, the substrate providing unit 360 loads the test substrate T from the test substrate raising and falling units 350 to move the test substrate T from the first stage 320 to the third stage 380.

When the test substrate T is moved to the third stage 380, the drop drying unit 370 falls (e.g., lowers to be proximate the test substrate T) to dry the test substrate T. In the present embodiment, a method of drying the test substrate T through the drop drying unit 370 is similar to that described above, and thus a detailed description thereof will be omitted.

When the organic drops O are completely dried, the test substrate T is transferred from the third stage 380 to the fourth stage 390. In the present embodiment, the test substrate T may be transferred according to various methods. For example, after the third stage 380 is transferred, the test substrate T may be transferred to the fourth stage 390 by the substrate providing unit 360. Also, after a position of the third stage 380 is fixed, the test substrate T may be unloaded by the substrate providing unit 360, and then transferred to the fourth stage 390. However, for descriptive convenience, a method of transferring the test substrate T from the third stage 380 to the fourth stage 390 by the substrate providing unit 360 will be described in detail.

In detail, when the organic drops O on the test substrate T are completely dried, the test substrate T is transferred from the third stage 380 to the fourth stage 390 by the substrate providing unit 360. In the present embodiment, the test substrate T may be raised from and lowered onto the third and fourth stages 380 and 390 using structures similar to the test substrate raising and falling units 350.

When the test substrate T is placed on the fourth stage 390, the pattern analyzer 343 checks patterns of the organic drops O. In the present embodiment, a method of checking the patterns of the organic drops O through the pattern analyzer 343 is performed as described above, and thus a detailed description thereof will be omitted.

After the pattern analyzer 343 analyzes the patterns of the organic drops O, as described, the drop dischargers 342 are controlled, based on the analysis result, to adjust the organic drops O discharged from the drop dischargers 342. In the present embodiment, a method and a factor for adjusting the organic drops O are similar to those described above, and thus detailed descriptions thereof will be omitted. Then, the main frame 341 may be positioned on the main substrate M, and the drop dischargers 342 may discharge modified patterns of the organic drops O onto the main substrate M.

Therefore, the display panel manufacturing device 300 separately tests the test substrate T, and does not need to apply the test substrate T to the main substrate M. As a result, logistical cost and manufacturing time are reduced. Also, the display panel manufacturing device 300 tests the test substrate T in conditions similar to the manufacturing conditions of the main substrate M to enable a more accurate test. In addition, the display panel manufacturing device 300 immediately applies the test result through a feedback, and thus a display panel is more precisely manufactured, and a failure rate is reduced.

The display panel manufacturing device 300 additionally forms the drop drying unit 370 for drying the test substrate T to avoid factors that may affect a process of the main substrate M due to drying of the test substrate T.

Figure 5:
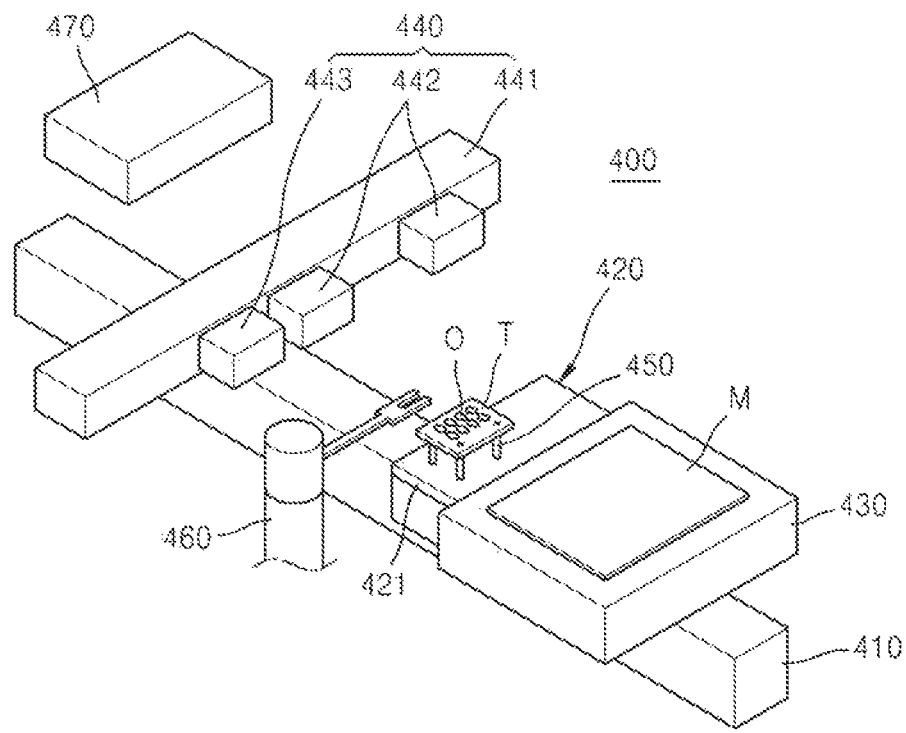
FIG. 5 is a view illustrating a display panel manufacturing device according to another exemplary embodiment of the present invention.

FIG. 5 is a view illustrating a display panel manufacturing device 400 according to another exemplary embodiment of the present invention. Referring to FIG. 5, the display panel manufacturing device 400 includes a stage slider 410, a first stage 420, a second stage 430, a patterning unit 440, test substrate raising and falling/lowering units 450, and a substrate providing unit 460. In the present embodiment, the stage slider 420, the first stage 420, the test substrate raising and falling units 450, and the substrate providing unit 460 are respectively similar to the stage slider 110, the first stage 120, the test substrate raising and falling units 150, and the substrate providing unit 160 described with reference to FIGS. 1 and 2A through 2G, and thus their detailed descriptions will be omitted.

In the present embodiment, the first and second stages 420 and 430 are installed to be adjacent each other. In detail, the first and second stages 420 and 430 may be, for example, coupled to each other or integrated into a single body.

The patterning unit 440 includes a main frame 441, drop dischargers 442, and a pattern analyzer 443. In the present embodiment, the patterning unit 440 may include the main frame 141, the drop dischargers 142, and/or the pattern analyzer 143 described with reference to the embodiment shown in FIGS. 1 and 2A through 2G. Alternatively, the pattern analyzer 440 may include the main frame 241/341, the drop dischargers 242/342, and/or the pattern analyzer 243/343 described with reference to the embodiments shown in FIGS. 3 and 4. However, for descriptive convenience, the patterning unit 440 will be described as including the main frame 141, the drop dischargers 142, and the pattern analyzer 143 described with reference to the embodiment shown in FIGS. 1 and 2A through 2G. The main frame 441, the drop dischargers 442, and the pattern analyzer 443 are the same as the main frame 131, the drop dischargers 142, and the pattern analyzer 143 described with reference to the embodiment shown in FIGS. 1 and 2A through 2G, and thus their detailed descriptions will be omitted.

The display panel manufacturing device 400 includes a test substrate heating unit 421, which may be installed at/on/in the first stage 420 to control a surface temperature of the first stage 420. For example, the test substrate heating unit 421 may include a heating device such as heat rays, a heater, or the like installed in the first stage 420. In the present embodiment, as described with reference to FIGS. 1 and 2A through 2G, the display panel manufacturing device 400 need not include a drop drying unit (e.g., drying unit) 470.

The display panel manufacturing device 400 may also include a third stage and a fourth stage. In the present embodiment, the third and fourth stages may be formed equally or similarly to the third and fourth stages 380 and 390 described with reference to FIGS. 3 and 4. However, for descriptive convenience, the first and second stages 420 and 430 will be described as being installed without the third and fourth stages.

A method of operating the display panel manufacturing device 400 may be similar to the methods described in the previous exemplary embodiments. In detail, a test substrate T is loaded on the first stage 420 by the test substrate providing unit 460. In the present embodiment, after the test substrate raising and falling units 450 rise, and when the test substrate T is placed thereon, the test substrate raising and falling units 450 lower to place the test substrate T on the first stage 420.

When the above-described process is completed, organic drops O are discharged onto the test substrate T through the drop dischargers 442. When the organic drops O are completely discharged onto the test substrate T, which is placed on the first stage 420, the test substrate T on the first stage 420 is heated by the test substrate heating unit 421. The organic drops O on the test substrate T are then dried and hardened by heating as described above.

The organic drops O on the test substrate T are dried as described above, and then patterns of the organic drops O are analyzed through the pattern analyzer 443. In the present embodiment, the method of analyzing the patterns of the organic drops O through the pattern analyzer 443 is similar to the above-described method, and thus a detailed description thereof will be omitted.

When the above-described process is completed, the main frame 441 performs a linear motion (e.g., moves linearly) in a longitudinal direction of the stage slider 410 to locate the drop dischargers 442 on/above the main substrate M.

In the present embodiment, after the pattern analyzer 443 analyzes the patterns of the organic drops O as described above, the drop dischargers 442 are controlled based on the analysis result to adjust the organic drops O discharged from the drop dischargers 442. A method and a factor for adjusting the organic drops O are similar to the method and the factor described in the previous exemplary embodiment, and thus a detailed description thereof will be omitted. In the present embodiment, the main frame 441 may be positioned on or over the main substrate M, and the drop dischargers 442 may discharge modified patterns of the organic drops O onto the main substrate M.

Accordingly, the display panel manufacturing device 400 separately tests the test substrate T, and then does not need to apply the test substrate T to the main substrate M. Therefore, logistical cost and manufacturing time are reduced. Also, the display panel manufacturing device 400 tests the test substrate T in conditions similar to the manufacturing conditions of the main substrate M to enable an accurate test. In addition, the display panel manufacturing device 400 immediately applies the test result through a feedback, and thus a display panel is precisely manufactured, and a failure rate is reduced.

Figure 6:
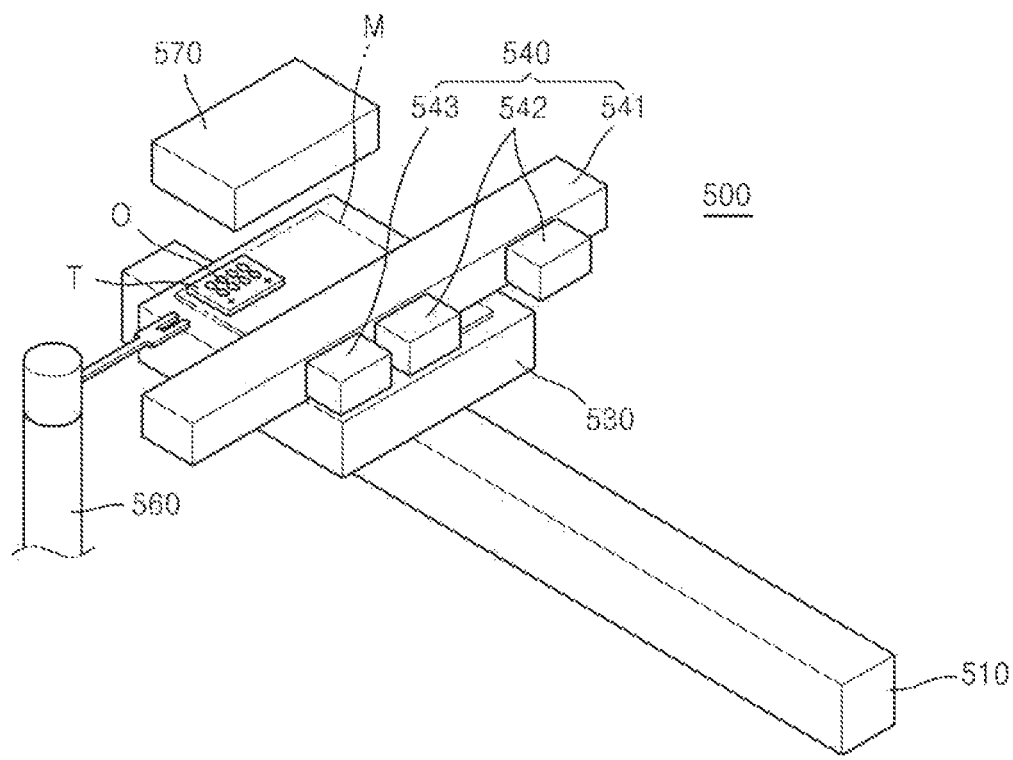
FIG. 6 is a view illustrating a display panel manufacturing device according to another exemplary embodiment of the present invention.

FIG. 6 is a view illustrating a display panel manufacturing device 500 according to another exemplary embodiment of the present invention. Referring to FIG. 6, the display panel manufacturing device 500 includes a stage slider 510, a second stage 530, a patterning unit 540, test substrate raising and falling units, a drop drying unit (e.g., drying unit) 570, and a substrate providing unit 560. In the present embodiment, the stage slider 510, the second stage 530, the test substrate raising and falling units, the drop drying unit 570, and the substrate providing unit 560 are respectively similar to the stage slider 110, the second stage 130, the test substrate raising and falling units 150, the drop drying unit 170, and the substrate providing unit 160 of the embodiment shown in FIGS. 1 and 2A through 2G, and thus their detailed descriptions will be omitted.

The patterning unit 540 of the present embodiment includes a main frame 541, drop dischargers 542, and a pattern analyzer 543. In the present embodiment, the patterning unit 540 may include the main frame 141, the drop dischargers 142, and the pattern analyzer 143 of the embodiment of FIGS. 1 and 2A through 2G, or may include the main frame 241/341, the drop dischargers 242/342, and/or the pattern analyzer 243/343 of the embodiments of FIGS. 3 and 4. However, for descriptive convenience, the patterning unit 540 will be hereinafter described as including the main frame 141, the drop dischargers 142, and the pattern analyzer 143 described with reference to FIGS. 1 and 2A through 2G. Also, the main frame 541, the drop dischargers 542, and the pattern analyzer 543 are respectively the same as the main frame 141, the drop dischargers 142, and the pattern analyzer 143 described with reference to FIGS. 1 and 2A through 2G.

The display panel manufacturing device 500 may include a third stage and a fourth stage. In the present embodiment, the third and fourth stages may be formed equally or similarly to the third and fourth stages 380 and 390 described with reference to FIGS. 3 and 4. However, for descriptive convenience, only the second stage 530 will be hereinafter described as being installed without the third and fourth stages.

Aligned marks (e.g., alignment marks) may be formed on the second stage 530 to align a test substrate T. In the present embodiment, the aligned marks may be formed and operate equally or similarly to the aligned marks 151 formed on the first stage 120 as described with reference to FIGS. 1 and 2A through 2G.

A method of operating the display panel manufacturing device 500 may be similar to the above-described method. In detail, the test substrate T is loaded on the second stage 530 by the substrate providing unit 560. In the present embodiment, after the test substrate raising and falling units raise, when the test substrate T is placed thereon, the test substrate raising and falling units lower to place the test substrate T on the second stage 530.

When the above-described process is completed, organic drops O are discharged onto the test substrate T through drop dischargers 542. When the organic drops O are completely discharged onto the test substrate T placed on the second stage 530, the second stage 530 performs a linear motion (e.g., moves) in a longitudinal direction of the stage slider 510 to place the test substrate T on a lower surface of the drop drying unit 570. In the present embodiment, the drop drying unit 570 falls to dry and harden the organic drops O on the test substrate T as described with reference to FIGS. 1 and 2A through 2G.

After the organic drops O are dried on the test substrate T as described above, patterns of the organic drops O are analyzed through a pattern analyzer 543. A method of analyzing the patterns of the organic drops O through the pattern analyzer 543 is similar to the above-described method, and thus a detailed description thereof will be omitted.

When the above-described process is completed, the substrate providing unit 560 unloads the test substrate T from the second stage 530, and then loads the main substrate M onto the second stage 530. Then, the main frame 541 moves in the longitudinal direction of the stage slider 510 to locate the drop dischargers 542 on or above the main substrate M.

In the present embodiment, after the organic drops O are analyzed as described above, the drop dischargers 542 are controlled based on the analysis result to adjust the organic drops O discharged from the drop dischargers 542. A method and a factor for adjusting the organic drops O is similar to the above-described method and factor, and thus detailed descriptions will be omitted. In the present embodiment, the main frame 541 is positioned on the main substrate M, and the drop dischargers 542 discharges modified patterns of the organic drops O onto the main substrate M.

Accordingly, the display panel manufacturing device 400 separately tests the test substrate T, and does not need to apply the test substrate T to the main substrate M. Therefore, logistical cost and manufacturing time are reduced. The display panel manufacturing device 500 tests the test substrate T in conditions similar to the manufacturing conditions of the main substrate M to enable an accurate test. Also, the display panel manufacturing device 500 immediately applies the test result through a feedback, and thus a display panel is precisely manufactured, and a failure rate is reduced.

Figure 7:
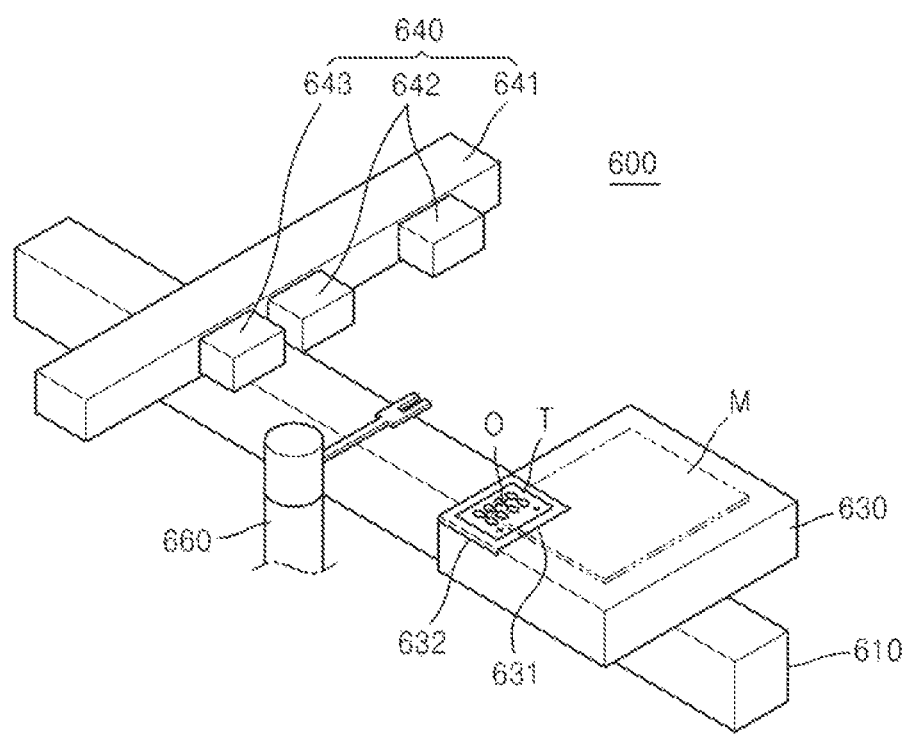
FIG. 7 is a view illustrating a display panel manufacturing device according to another exemplary embodiment of the present invention.

FIG. 7 is a view illustrating a display panel manufacturing device 600 according to another exemplary embodiment of the present invention. Referring to FIG. 7, the display panel manufacturing device 600 includes a stage slider 610, a second stage 630, a patterning unit 640, test substrate raising and falling units, and a substrate providing unit 660. In the present embodiment, the stage slider 610, the second stage 630, the test substrate raising and falling units, and the substrate providing unit 660 are respectively similar to the stage slider 510, the second stage 530, the test substrate raising and falling units, and the substrate providing unit 560 described with reference to FIG. 6, and thus their detailed descriptions will be omitted.

The patterning unit 640 includes a main frame 641, drop dischargers 642, and the pattern analyzer 643. In the present embodiment, the patterning unit 640 may include the main frame 141/241/341, the drop dischargers 142/242/342, and/or the pattern analyzer 143/243/343 of the embodiments described with reference to FIGS. 1 through 4. However, for descriptive convenience, the patterning unit 640 will be hereinafter described as including the main frame 141, the drop dischargers 142, and the pattern analyzer 143 of the embodiment shown in FIGS. 1 and 2A through 2G. Also, the main frame 641, the drop dischargers 642, and the pattern analyzer 643 are the same as the main frame 141, the drop dischargers 142, and the pattern analyzer 143 described with reference to FIGS. 1 and 2A through 2G, and thus their detailed descriptions will be omitted.

The display panel manufacturing device 600 may include a third stage and a fourth stage. In the present embodiment, the third and fourth stages are the same as the third and fourth stages 380 and 390 described with reference to FIGS. 3 and 4. However, for descriptive convenience, only the second stage 630 will be hereinafter described as being installed without the third and fourth stages.

The second stage 630 includes a test substrate placing unit 631 that places the test substrate T on the second stage 630. In the present embodiment, the test substrate placing unit 631 includes a test substrate heating unit 632 that heats a test substrate T to harden organic drops O. In particular, the test substrate heating unit 632 may be formed in a plate form, and may include a heating device such as heat rays, a heater, or the like.

A method of operating the display panel manufacturing device 600 may be similar to the above-described method. In detail, the test substrate T is loaded onto the second stage 630 by the substrate providing unit 660. In the present embodiment, the test substrate T is placed on the test substrate placing unit 631 on the second stage 630. In particular, the test substrate raising and falling units are installed at the test substrate placing unit 631, and then rise. Also, after the test substrate T is placed on the test substrate raising and falling units, the test substrate raising and falling units fall to place the test substrate T on the second stage 630.

When the above-described process is completed, the organic drops O are discharged onto the test substrate T through the drop dischargers 642. When the organic drops O are completely discharged onto the test substrate T on the second state 630, the test substrate heating unit 632 operates to dry and harden the organic drops O on the test substrate T.

After the organic drops O on the test substrate T are dried, as described above, patterns of the organic drops O are analyzed through the pattern analyzer 643. In the present embodiment, a method of analyzing the patterns of the organic drops O through the pattern analyzer 643 is similar to the above-described method, and thus a detailed description thereof will be omitted.

When the above-described process is completed, the substrate providing unit 660 unloads the test substrate T from the second stage 630, and loads the main substrate M onto the second stage 630. In the present embodiment, the test substrate raising and falling units operate to separate the test substrate T from the test substrate placing unit 631.

When the above-described process is completed, the main frame 641 performs a linear motion (e.g., moves) in a longitudinal direction of the stage slider 610 to locate the drop dischargers 642 on the main substrate M.

In the present embodiment, after the patterns of the organic drops O are analyzed as described above, the drop dischargers 642 are controlled based on the results of the analysis to adjust the organic drops O discharged from the drop dischargers 642. A method and a factor for adjusting the organic drops O are similar to the above-described method and factor, and thus their detailed descriptions will be omitted. In the present embodiment, the main frame 641 is positioned on the main substrate M, and the drop dischargers 642 discharges modified patterns of the organic drops O onto the main substrate M.

Accordingly, the display panel manufacturing device 600 separately tests the test substrate T, and does not need to apply the test substrate T to the main substrate M. Therefore, logistical cost and manufacturing time are reduced. The display panel manufacturing device 600 also tests the test substrate T in the same conditions as manufacturing conditions of the main substrate M to enable an accurate test. The display panel manufacturing device 600 also immediately applies the test result through a feedback, and thus a display panel is precisely manufactured, and a failure rate is reduced.

According to exemplary embodiments of the present invention as described above, after a test substrate is tested, a main substrate does not need to be applied. Therefore, logistical cost and manufacturing time are reduced. Also, the test substrate is tested in conditions that are similar to the manufacturing conditions of the main substrate to enable an accurate test. In addition, the test result is immediately applied through a feedback, and thus a display panel is precisely manufactured, and a failure rate is reduced.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A display panel manufacturing device comprising:
a stage slider;
a second stage at the stage slider and configured to receive a test substrate or a main substrate thereon;
a patterning unit located at a distance from the stage slider, and configured to discharge organic drops onto the test substrate, configured to analyze patterns of the organic drops to enable modification of the patterns of the organic drops, and configured to discharge modified patterns onto the main substrate; and
test substrate raising and lowering units located at, and coupled to, the second stage and configured to separate the test substrate from the second stage by adjusting a vertical position of the test substrate with respect to the second stage,
wherein the second stage comprises a test substrate placing unit configured to place the test substrate on the second stage, the test substrate raising and lowering units being installed at the test substrate placing unit and configured to place the test substrate on, and to separate the test substrate from, the test substrate placing unit,
wherein the test substrate placing unit comprises a test substrate heating unit configured to heat the test substrate to harden the organic drops,
wherein the test substrate placing unit is on the second stage and smaller than the second stage, and
wherein the test substrate is smaller than the main substrate.

2. The display panel manufacturing device of claim 1, further comprising a substrate providing unit configured to move in a longitudinal direction of the stage slider and configured to load the test substrate onto the second stage or to unload the test substrate from the second stage.

3. The display panel manufacturing device of claim 1, wherein the patterning unit comprises:
a main frame located at a distance from the stage slider and configured to move in a longitudinal direction of the stage slider and in a direction perpendicular to the longitudinal direction; and
one or more drop dischargers located at the main frame and configured to discharge the organic drops onto the test substrate or the main substrate.

4. The display panel manufacturing device of claim 3, wherein the patterning unit comprises a pattern analyzer located at the main frame and configured to analyze patterns of the organic drops discharged from the drop dischargers onto the test substrate.

5. The display panel manufacturing device of claim 3, wherein the patterning unit further comprises a pattern analyzer located at a distance from the main frame and the stage slider and configured to analyze the patterns of the organic drops discharged onto the test substrate.

6. The display panel manufacturing device of claim 5, further comprising a fourth stage located at a lower surface of the pattern analyzer and configured to receive the test substrate, on which the patterns of the organic drops are formed, thereon.

7. The display panel manufacturing device of claim 1, further comprising aligned marks at the second stage.

8. A display panel manufacturing device comprising:
a stage slider;
a second stage at the stage slider and configured to receive a test substrate or a main substrate thereon;
a patterning unit located at a distance from the stage slider, and configured to discharge organic drops onto the test substrate, configured to analyze patterns of the organic drops to enable modification of the patterns of the organic drops, and configured to discharge modified patterns onto the main substrate;
test substrate raising and lowering units located at, and coupled to, the second stage and configured to separate the test substrate from the second stage by adjusting a vertical position of the test substrate with respect to the second stage; and
a drying unit located at a distance from the stage slider and configured to dry the organic drops discharged onto the test substrate by dropping onto the test substrate when the second stage moves along the stage slider to be positioned under the drying unit, and by contacting the test substrate,
wherein the test substrate is smaller than the main substrate,
wherein the drying unit dries the organic drops on the test substrate in a vacuum state by heating, and
wherein a position of the second stage for discharging organic drops onto the test substrate is different from a position of the second stage for drying the organic drops.

9. The display panel manufacturing device of claim 8, further comprising a third stage facing the drying unit and configured to receive the test substrate thereon.

* * * * *